(12) United States Patent
Wu et al.

(10) Patent No.: US 8,090,070 B2
(45) Date of Patent: Jan. 3, 2012

(54) SYNCHRONIZING DEVICE FOR USB REAL-TIME AUDIO DATA TRANSMISSION

(75) Inventors: Min-Shing Wu, Hsinchu (TW); Chuen-An Lin, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 572 days.

(21) Appl. No.: 12/270,970

(22) Filed: Nov. 14, 2008

(65) Prior Publication Data
US 2010/0054387 A1    Mar. 4, 2010

(30) Foreign Application Priority Data

Aug. 26, 2008  (TW) .............................. 97132542 A

(51) Int. Cl.
*H03D 3/24* (2006.01)
(52) U.S. Cl. ........................................ 375/376; 331/1 A
(58) Field of Classification Search .................. 370/491, 370/500; 375/354, 362, 371, 376; 713/400
See application file for complete search history.

(56) References Cited

U.S. PATENT DOCUMENTS

2007/0296509 A1 * 12/2007  Yang et al. ..................... 331/1 A

* cited by examiner

*Primary Examiner* — David C. Payne
*Assistant Examiner* — Leon-Viet Nguyen
(74) *Attorney, Agent, or Firm* — WPAT., P.C.; Justin King

(57) ABSTRACT

The present invention discloses a synchronizing device for real-time USB audio data transmission, comprising: a first adder unit, a start-of-frame countdown unit, a phase-locked loop circuit, a frequency divider, a second adder unit, a third adder unit, a fourth adder unit, a frame calibrating register unit, a calibrating mapping unit and a calibrating pulse generating unit. A start-of-frame token sent by the USB host is used as a 1-ms reference cycle so that a high-frequency clock passes through the frequency divider to issue a first clock. The first clock signal has a constant clock number in a USB start-of-frame. The absolute time is automatically adjusted according to the duration of a previous start-of-frame. Therefore, asynchronicity of data transmission between the USB host and external devices can be overcome.

10 Claims, 2 Drawing Sheets

SYNCHRONIZING DEVICE FOR USB REAL-TIME AUDIO DATA TRANSMISSION

BACKGROUND OF THE INVENTION

1. Field of the Invention

The present invention generally relates to a synchronizing device for real-time USB audio data transmission and, more particularly, to a synchronizing device capable of overcoming asynchronicity of data transmission between the USB host and external devices.

2. Description of the Prior Art

FIG. 1 is a circuit block of a conventional synchronizing device for real-time USB audio data transmission. Referring to FIG. 1, a conventional synchronizing device for real-time USB audio data transmission 1 comprises a difference adder unit 2, a frame calibrating register unit 3, a calibrating mapping unit 4, a calibrating pulse generating unit 5, a frequency divider 6, a start-of-frame countdown unit 7 and three adder units 8. In FIG. 1, the first clock signal CLKOUT is a clock signal issued by the frequency divider 6 into which the second clock signal CLK4X is input. The frequency dividing factor selection signal ADJSIGN determines the fractional relation (1/3.5 or 1/4.5) of the frequency divider 6. The calibrating pulse signal ADJLOAD determines that the first clock signal CLKOUT equals to the second clock signal CLK4X divided by 3.5 or 4.5 at some timing and by 4 at other timing.

When the target frequency is 12.288 MHz, the initial value of the start-of-frame countdown unit 7 is 12288. The start-of-frame countdown unit 7 receives the start-of-frame signal SOFP and the first clock signal CLKOUT, wherein the start-of-frame signal SOFP is a start-of-frame sent by the USB host (not shown) and a clock signal decoded by a serial interface engine (not shown) to be used as a synchronous signal. When the start-of-frame signal SOFP signal is input into the start-of-frame countdown unit 7, countdown begins and will not stop until a next start-of-frame signal SOFP signal is received. Meanwhile, the start-of-frame countdown unit 7 sends the clock number difference DIFF to the frame calibrating register unit 3 and the difference adder unit 2, and resets the value back to 12288.

Since the time for the first clock signal CLKOUT to count a start-of-frame is not exactly an integral multiple of the clock cycle of the first clock signal CLKOUT, indicating that there is time difference in each clock cycle of the first clock signal CLKOUT within each start-of-frame time, the accumulative time difference may exceed a clock cycle of the first clock signal CLKOUT after several start-of-frame times. As a result, the target frequency difference will become significant and a difference adder unit 2 is required to eliminate the accumulative error.

The frame calibrating register unit 3 records the clock number difference DIFF value in a previous start-of-frame time and inputs the clock number difference DIFF value into the calibrating mapping unit 4 to a frequency dividing factor selection signal ADJSIGN and an adjusted number value ADJMAP. The adjusted number value ADJMAP controls the calibrating pulse generating unit 5 to issue a calibrating pulse signal ADJLOAD signal. The calibrating pulse signal ADJLOAD and the frequency dividing factor selection signal ADJSIGN determine the timing for the frequency divider 6 to be divided by 3.5 or 4.5.

In the prior art device, a difference of only 12 clock cycles of the first clock signal CLKOUT appears when the target frequency is 12.288 MHz and the input frequency of 49.2 MHz is divided. However, in a practical USB circuit, a 49.2-MHz phase-locked loop circuit is required. For example, when the target frequency is 12.288 MHz, a difference of 288 clock cycles of the first clock signal CLKOUT appears after a 48-MHz clock is frequency divided. Therefore, the mapping table must be enhanced and a larger difference appears between the output frequency and the target frequency.

Therefore, there exists a need in providing a synchronizing device for USB real-time audio data transmission capable of overcoming asynchronicity of data transmission between the USB host and external devices.

SUMMARY OF THE INVENTION

It is one object of the present invention to provide a synchronizing device for USB real-time audio data transmission capable of overcoming asynchronicity of data transmission between the USB host and external devices.

In order to achieve the foregoing object, the present invention provides a synchronizing device for real-time USB audio data transmission, comprising: a first adder unit receiving a plurality of start-of-frame signals and obtaining a summation of the start-of-frame signals; a start-of-frame countdown unit using a phase-locked signal as a clock after receiving a first start-of-frame signal of the start-of-frame signals to countdown from an initial value until the start-of-frame countdown unit receives a next start-of-frame signal to issue a clock number difference and store the initial value in the start-of-frame countdown unit; a phase-locked loop circuit receiving a first clock signal to issue the phase-locked signal; a frequency divider receiving a second clock signal to determine a frequency dividing factor to be applied to the second clock signal according to a frequency dividing factor selection signal and control the timing for frequency dividing according to a calibrating pulse signal to issue the first clock signal; a second adder unit summing up the start-of-frame signal summation, the clock number difference and a time difference accumulated value to issue a time difference accumulated input value; a third adder unit receiving the time difference accumulated input value to issue the time difference accumulated value and the time difference accumulated input value; a fourth adder unit summing up the clock number difference, the time difference accumulated input value and an adjusted clock number signal to issue an adjusted clock number signal accumulated value; a frame calibrating register unit receiving the adjusted clock number signal accumulated value to issue the adjusted clock number signal; a fifth adder unit summing up the adjusted clock number signal and the time difference accumulated input value to issue an adjusted clock number input value; a calibrating mapping unit receiving the adjusted clock number input value to issue an adjusted number value and the frequency dividing factor selection signal; and a calibrating pulse generating unit receiving the adjusted number value to issue the calibrating pulse signal.

A start-of-frame token sent by the USB host is used as a 1-ms reference cycle so that a high-frequency clock passes through the frequency divider to issue a first clock. The first clock signal has a constant clock number in a USB start-of-frame. The absolute time is automatically adjusted according to the duration of a previous start-of-frame. Therefore, asynchronicity of data transmission between the USB host and external devices can be overcome.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention can be exemplified by the preferred embodiment as described hereinafter.

Figure 1:
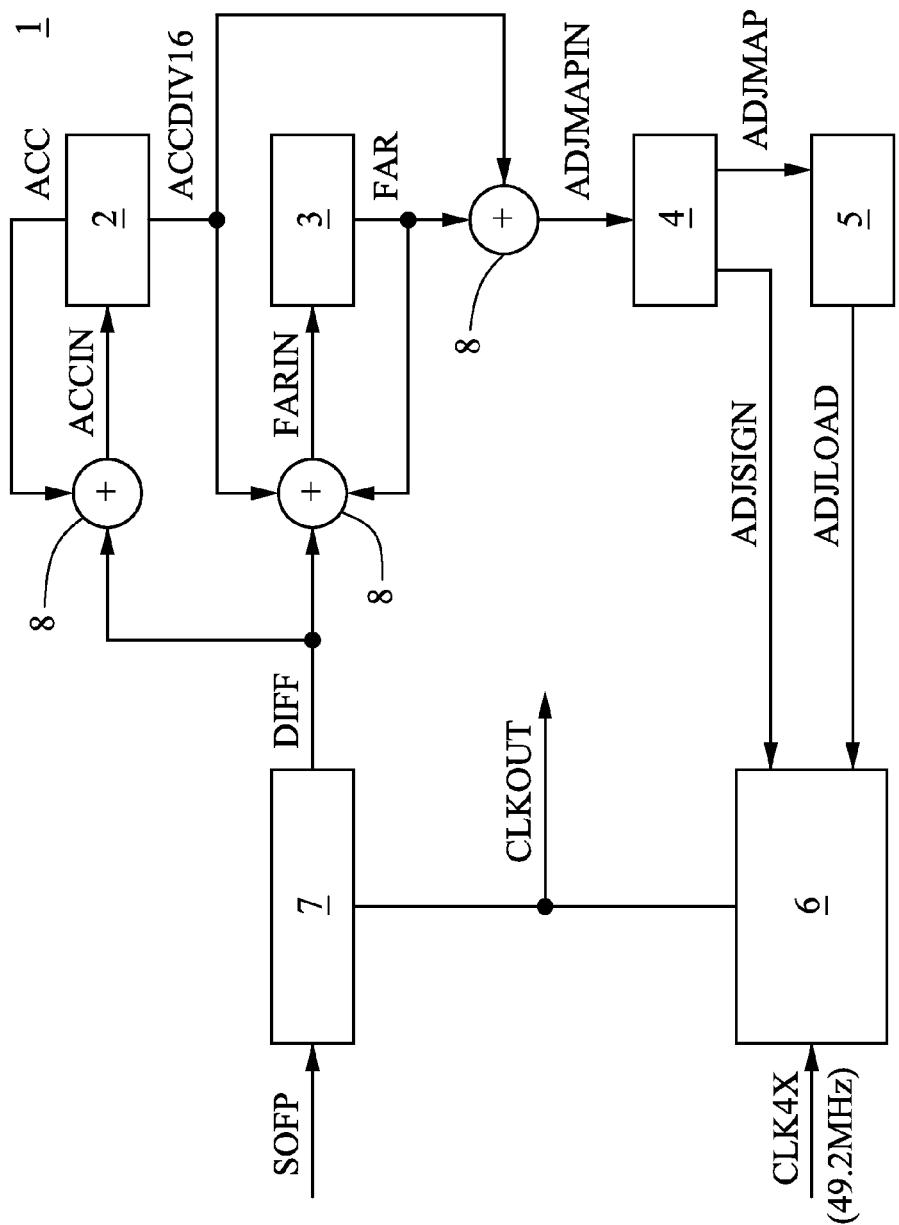
FIG. 1 is a circuit block of a conventional synchronizing device for real-time USB audio data transmission.
Figure 2:
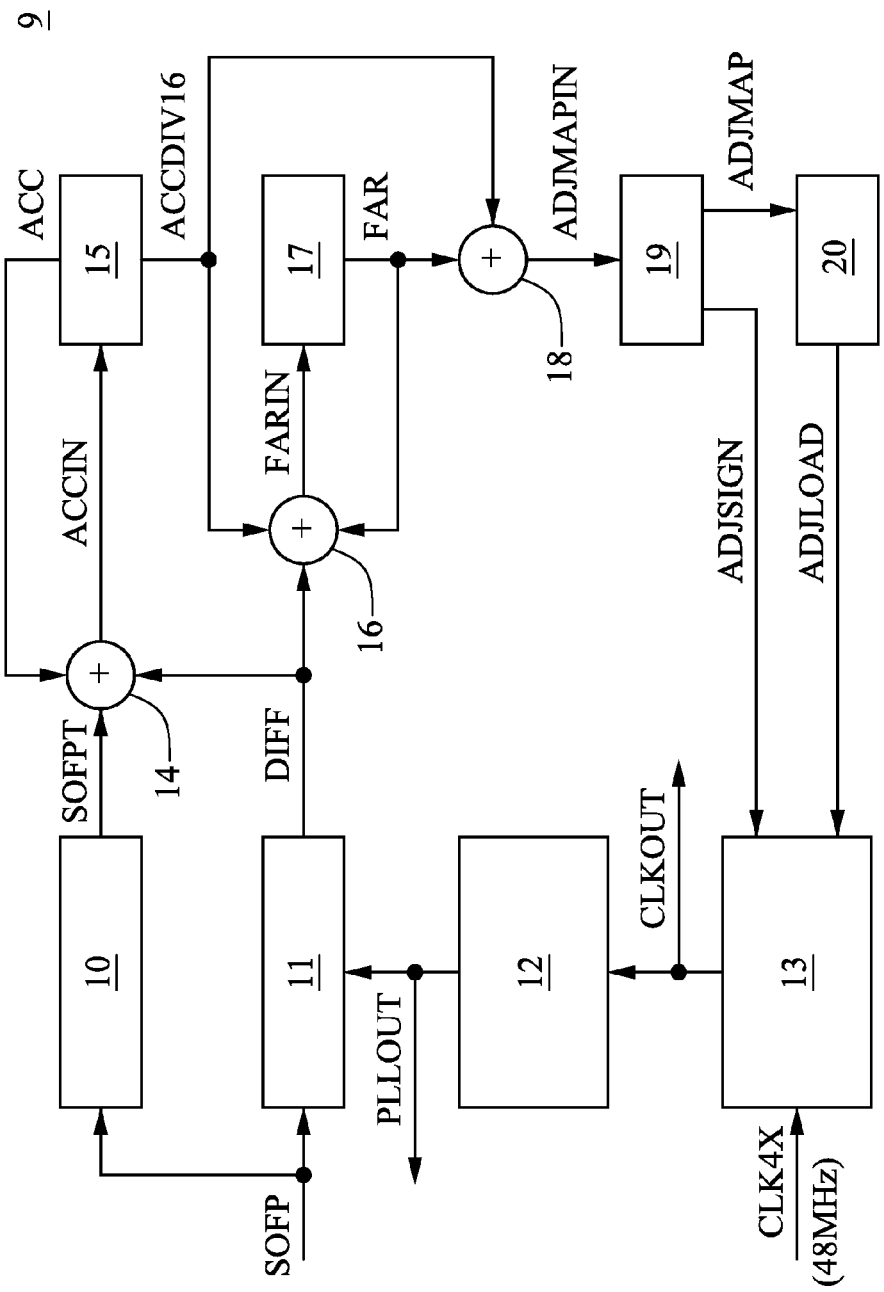
FIG. 2 is a circuit block of a synchronizing device for real-time USB audio data transmission according to the preferred embodiment of the present invention.

Please refer to FIG. 2, which is a circuit block of a synchronizing device for real-time USB audio data transmission according to the preferred embodiment of the present invention. The synchronizing device for real-time USB audio data transmission of the present invention comprises: a first adder unit 10, for example a floating number adder unit, for receiving a plurality of start-of-frame signals SOFP and obtaining a summation of the start-of-frame signals SOFPT; a start-of-frame countdown unit 11 using a phase-locked signal PLLOUT as a clock after receiving a first start-of-frame signal SOFP of the start-of-frame signals to countdown from an initial value until the start-of-frame countdown unit 11 receives a next start-of-frame signal SOFP to issue a clock number difference DIFF and store the initial value in the start-of-frame countdown unit 11, wherein the initial value is 12288 when the frequency of the first clock signal CLKOUT is 12.288 MHz, and the initial value is 11289 when the frequency of the first clock signal CLKOUT is 11.2896 MHz; a phase-locked loop circuit 12, preferably an analog phase-locked loop circuit for eliminating jitter, receiving a first clock signal CLKOUT to issue the phase-locked signal PLLOUT, wherein the frequency of the first clock signal CLKOUT is 12.288 MHz or 11.2896 MHz; a frequency divider 13, such as a fractional frequency divider with a frequency dividing factor of 3.5, 4 or 4.5, receiving a second clock signal CLK4X, for example a 48-MHz signal, to determine a frequency dividing factor to be applied to the second clock signal CLK4X according to a frequency dividing factor selection signal ADJSIGN and control the timing for the frequency divider 13 according to a calibrating pulse signal ADJLOAD to issue the first clock signal CLKOUT; a second adder unit 14 summing up the start-of-frame signal summation SOFPT, the clock number difference DIFF and a time difference accumulated value ACC to issue a time difference accumulated input value ACCIN; a third adder unit 15, such as a difference adder unit for eliminating the accumulated time error, receiving the time difference accumulated input value ACCIN to issue the time difference accumulated value ACC and the time difference accumulated input value ACCDIV 16; a fourth adder unit 16 summing up the clock number difference DIFF, the time difference accumulated input value ACCIN and an adjusted clock number signal FAR to issue an adjusted clock number signal accumulated value FARIN; a frame calibrating register unit 17 receiving the adjusted clock number signal accumulated value FARIN, to issue the adjusted clock number signal FAR; a fifth adder unit 18 summing up the adjusted clock number signal FAR and the time difference accumulated input value ACCDIV16 to issue an adjusted clock number input value ADJMAPIN; a calibrating mapping unit 19, such as a floating number calibrating mapping unit, receiving the adjusted clock number input value ADJMAPIN to issue an adjusted number value ADJMAP and the frequency dividing factor selection signal ADJSIGN; and a calibrating pulse generating unit 20 receiving the adjusted number value ADJMAP to issue the calibrating pulse signal ADJLOAD.

Since the synchronizing device for real-time USB audio data transmission of the present invention is applied with a 48-MHz clock as the phase-locked loop circuit, the target frequency is not only 12.288 MHz but is added to by a 11.2896-MH clock. For example, when the target frequency is 12.288 MHz, a difference of 288 clock cycles of the first clock signal CLKOUT appears after a 48-MHz clock is frequency divided. In the prior art, the mapping table must be enhanced and a larger difference appears between the output frequency and the target frequency. In the present invention, however, a fractional frequency divider is added to effectively reduce the difference.

Since the first clock signal CLKOUT is issued by a digital frequency divider to exhibit more significant jitter, an analog phase-locked loop circuit is required to issue a reduced jitter phase-locked signal if the circuit using the clock signal has lower jitter resistance. Accordingly, the chip size and manufacturing cost will be increased. In the present invention, a floating number adder unit is used to deal with the clock difference when the target frequency contains a decimal portion. For example, if the target frequency is 11.2896 MHz, each start-of-frame exhibits a difference of 0.6 clock cycle of the first clock signal CLKOUT clock cycle. The floating number adder unit sums up the difference and the accumulated difference to adjust the clock.

Accordingly, the present invention provides a synchronizing device for real-time USB audio data transmission capable of overcoming asynchronicity of data transmission between the USB host and external devices. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A synchronizing device for real-time USB audio data transmission, comprising:
   a first adder unit receiving a plurality of start-of-frame signals and obtaining a summation of the start-of-frame signals;
   a start-of-frame countdown unit using a phase-locked signal as a clock after receiving a first start-of-frame signal of the start-of-frame signals to countdown from an initial value until the start-of-frame countdown unit receives a next start-of-frame signal to issue a clock number difference and store the initial value in the start-of-frame countdown unit;
   a phase-locked loop circuit receiving a first clock signal to issue the phase-locked signal;
   a frequency divider receiving a second clock signal to determine a frequency dividing factor to be applied to the second clock signal according to a frequency dividing factor selection signal and control the timing for frequency dividing according to a calibrating pulse signal to issue the first clock signal;
   a second adder unit summing up the start-of-frame signal summation, the clock number difference and a time difference accumulated value to issue a time difference accumulated input value;
   a third adder unit receiving the time difference accumulated input value to issue the time difference accumulated value and the time difference accumulated input value;
   a fourth adder unit summing up the clock number difference, the time difference accumulated input value and an adjusted clock number signal to issue an adjusted clock number signal accumulated value;

a frame calibrating register unit receiving the adjusted clock number signal accumulated value to issue the adjusted clock number signal;

a fifth adder unit summing up the adjusted clock number signal and the time difference accumulated input value to issue an adjusted clock number input value;

a calibrating mapping unit receiving the adjusted clock number input value to issue an adjusted number value and the frequency dividing factor selection signal; and a calibrating pulse generating unit receiving the adjusted number value to issue the calibrating pulse signal.

2. The synchronizing device for real-time USB audio data transmission as recited in claim 1, wherein the first adder unit is a floating number adder unit.

3. The synchronizing device for real-time USB audio data transmission as recited in claim 1, wherein the third adder unit is a difference adder unit.

4. The synchronizing device for real-time USB audio data transmission as recited in claim 1, wherein the calibrating mapping unit is a floating number calibrating mapping unit.

5. The synchronizing device for real-time USB audio data transmission as recited in claim 1, wherein the phase-locked loop circuit is an analog phase-locked loop circuit.

6. The synchronizing device for real-time USB audio data transmission as recited in claim 1, wherein the frequency of the second clock signal is 48 MHz.

7. The synchronizing device for real-time USB audio data transmission as recited in claim 1, wherein the frequency divider is a fractional frequency divider.

8. The synchronizing device for real-time USB audio data transmission as recited in claim 7, wherein the frequency dividing factor is 3.5, 4 or 4.5.

9. The synchronizing device for real-time USB audio data transmission as recited in claim 1, wherein the frequency of the first clock signal is 12.288 MHz or 11.2896 MHz.

10. The synchronizing device for real-time USB audio data transmission as recited in claim 9, wherein the initial value is 12288 when the frequency of the first clock signal is 12.288 MHz, and the initial value is 11289 when the frequency of the first clock signal is 11.2896 MHz.

* * * * *